(12) United States Patent
Komizo et al.

(10) Patent No.: US 11,906,896 B2
(45) Date of Patent: Feb. 20, 2024

(54) REFLECTIVE PHOTOMASK BLANK AND REFLECTIVE PHOTOMASK

(71) Applicant: TOPPAN PRINTING CO., LTD., Tokyo (JP)

(72) Inventors: Toru Komizo, Tokyo (JP); Norihito Fukugami, Tokyo (JP); Genta Watanabe, Tokyo (JP); Eisuke Narita, Tokyo (JP)

(73) Assignee: TOPPAN PHOTOMASK CO., LTD., Tokyo (JP)

( * ) Notice: Subject to any disclaimer, the term of this patent is extended or adjusted under 35 U.S.C. 154(b) by 482 days.

(21) Appl. No.: 17/292,409

(22) PCT Filed: Nov. 1, 2019

(86) PCT No.: PCT/JP2019/043070
§ 371 (c)(1),
(2) Date: May 7, 2021

(87) PCT Pub. No.: WO2020/100632
PCT Pub. Date: May 22, 2020

(65) Prior Publication Data
US 2022/0011662 A1 Jan. 13, 2022

(30) Foreign Application Priority Data

Nov. 15, 2018 (JP) ................... 2018-214833

(51) Int. Cl.
*G03F 1/24* (2012.01)
(52) U.S. Cl.
CPC ..................... *G03F 1/24* (2013.01)
(58) Field of Classification Search
CPC ........................................ G03F 1/24
USPC ............................................ 430/5
See application file for complete search history.

(56) References Cited

U.S. PATENT DOCUMENTS

| 7,906,259 B2 | 3/2011 | Hayashi et al. |
| 9,529,250 B2 | 12/2016 | Hsieh et al. |
| 2009/0011341 A1 | 1/2009 | Hayashi et al. |
| 2016/0124297 A1 | 5/2016 | Hsieh et al. |
| 2017/0131627 A1 | 5/2017 | Hassan et al. |

FOREIGN PATENT DOCUMENTS

| EP | 3454119 A1 | 3/2019 |
| JP | 2001-237174 A | 8/2001 |
| JP | 2007-273678 A | 10/2007 |
| JP | 2010-103463 A | 5/2010 |
| JP | 2018-120009 A | 8/2018 |
| KR | 101579852 B1 | 12/2015 |
| TW | 200807144 A | 2/2008 |
| TW | 201627750 A | 8/2016 |
| WO | WO 2011-004850 A1 | 1/2011 |

OTHER PUBLICATIONS

International Search Report and Written Opinion for International Patent Application No. PCT/JP2019/043070, 8 pages, with translation, dated Jan. 28, 2020.
EPO Communication dated Jul. 19, 2022 forwarding the extended European Search Report for European Patent Application No. 19885829.2, 8 pages.
International Preliminary Report on Patentability dated May 18, 2021, and an English translation of Written Opinion of the International Searching Authority dated Jan. 28, 2020, in International Patent Application No. PCT/JP2019/043070, 6 pages.

*Primary Examiner* — Christopher G Young
(74) *Attorney, Agent, or Firm* — Squire Patton Boggs (US) LLP

(57) ABSTRACT

There is provided a reflective photomask blank and a reflective photomask having good irradiation resistance and capable of obtaining good transfer performance. A reflective photomask blank (10) contains a reflective layer (2) reflecting incident light and an absorption layer (4) absorbing incident light, which are formed in this order on one surface side of a substrate (1). The absorption layer (4) contains a first material selected from the group consisting of tin, indium, and tellurium and a second material containing one or two or more kinds of materials selected from the group consisting of transition metals, bismuth (Bi), and silicon (Si) at least in the outermost layer. The content of the second material is more than 20 at and less than 50 at % in the same layer.

17 Claims, 7 Drawing Sheets

REFLECTIVE PHOTOMASK BLANK AND REFLECTIVE PHOTOMASK

TECHNICAL FIELD

The present invention relates to a reflective photomask blank and a reflective photomask. The present invention is a technology suitable particularly for an EUV photomask.

BACKGROUND ART

In manufacturing processes of semiconductor devices, a demand for a finer photolithography technology has increased with the miniaturization of semiconductor devices. In the photolithography, the minimum resolution dimension of a transfer pattern highly depends on the wavelength of an exposure light source, and thus the minimum resolution dimension can be further reduced as the wavelength is shorter. Therefore, a conventional exposure light source using an ArF excimer laser light having a wavelength of 193 nm has been replaced with an exposure light source in the Extreme Ultra Violet (EUV) region having a wavelength of 13.5 nm in the manufacturing processes of semiconductor devices.

However, most substances have high light absorbability to light in the EUV region. Therefore, an EUV exposure photomask (EUV photomask) is a reflective photomask, unlike a conventional transmissive photomask (see, for example, PTL 1). PTL 1 discloses forming a multilayer film in which two or more of material layers are cyclically deposited is formed on a base substrate, and then forming a mask pattern containing a metal film including nitride or a mask pattern containing a deposited structure of a metal nitride film and a metal film on the multilayer film in a reflective exposure mask used for EUV lithography.

Further, a dioptric system utilizing the transmission of light cannot be used in the EUV lithography as described above, and therefore a mirror, instead of a lens, is used for an optical system member of an exposure machine. Hence, there is a problem that incident light and reflected light to the EUV photomask cannot be coaxially designed. The EUV lithography employs, for example, a technology including making an EUV light incident by tilting the optical axis by 6° from a direction perpendicular to the surface of the EUV photomask and guiding reflected light reflected at an angle of −6° to a semiconductor substrate.

As described above, the optical axis is tilted in the EUV lithography. Therefore, the EUV light incident on the EUV photomask creates a shadow of a mask pattern (absorption layer pattern) of the EUV photomask, which poses a problem referred to as a projection effect in which the transfer performance deteriorates in some cases.

CITATION LIST

Patent Literature

PTL 1: JP 2001-237174 A

SUMMARY OF INVENTION

Technical Problem

In a current EUV exposure apparatus, the inside of the apparatus is brought into a hydrogen radical atmosphere to prevent the inside of the apparatus from being contaminated by outgas components from a resist applied onto a wafer during the EUV exposure. Therefore, the EUV photomask is required to have durability against the EUV irradiation (irradiation resistance) under the hydrogen radical atmosphere so that the absorption layer is not damaged by a reaction with the hydrogen radicals.

The present invention has been made focusing on the above-described points. It is an object of the present invention to provide a reflective photomask blank and a reflective photomask having good irradiation resistance and capable of obtaining good transfer performance.

Solution to Problem

In order to solve the problem, a reflective photomask blank according to one aspect of the present invention contains a reflective layer configured to reflect incident light and an absorption layer configured to absorb incident light, which are formed in this order on one surface side of a substrate, in which the absorption layer contains a first material selected from the group consisting of tin, indium, and tellurium and a second material containing one or two or more of materials selected from the group consisting of transition metals, bismuth (Bi), and silicon (Si) at least in the outermost layer and the content of the second material is more than 20 at % and less than 50 at % in the same layer.

A reflective photomask according to one aspect of the present invention contains a reflective layer formed on one surface side of a substrate and configured to reflect incident light and an absorption layer formed by a predetermined pattern on the reflective layer and configured to absorb incident light, in which at least the outermost layer of the absorption layer contains a first material selected from the group consisting of tin, indium, and tellurium and a second material containing one or two or more of materials selected from the group consisting of transition metals, bismuth (Bi), and silicon (Si) and the content of the second material is more than 20 at % and less than 50 at % in the same layer.

Advantageous Effects of Invention

According to the aspects of the present invention, the irradiation resistance during the EUV exposure can be improved, and therefore the life of the reflective photomask can be extended. Further, according to the aspects of the present invention, even when the absorption film is reduced in thickness, high EUV light absorbability can be achieved. Therefore, the influence of the projection effect is reduced and the resolution of a pattern transferred onto a wafer can be improved.

DESCRIPTION OF EMBODIMENTS

Figure 1:
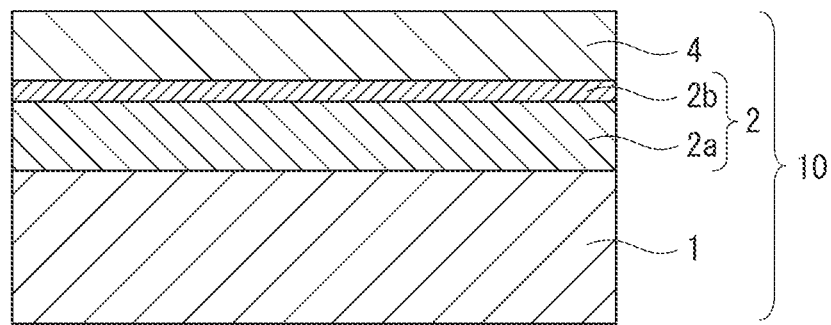
FIG. 1 is a schematic cross-sectional view illustrating the structure of a reflective photomask blank according to an embodiment based on the present invention.

Embodiments of the present invention will now be described with reference to the drawings.

It should be noted that each figure is a schematically illustrated figure and the size, the shape, and the like of each part are exaggerated as appropriate for ease of understanding. Further, for simplification of description, the same reference numerals are given to the corresponding parts in each figure.

(Reflective Photomask Blank)

A reflective photomask blank according to this embodiment is a photomask blank for forming a reflective photomask reflecting EUV light and irradiating a transfer sample with the reflected light.

As illustrated in FIG. 1, a reflective photomask blank 10 of this embodiment contains a substrate 1, a reflective layer 2 deposited on the substrate 1, and an absorption layer 4 deposited on the reflective layer 2.

The reflective layer 2 is a layer reflecting incident light. The reflective layer 2 illustrated in FIG. 1 contains a multilayer reflective layer 2a containing a multilayer structure and an intermediate layer 2b.

The absorption layer 4 is a layer absorbing incident light. The absorption layer 4 contains a single layer structure or a multilayer structure in which a plurality of layers is deposited.

(Reflective Photomask)

Figure 2:
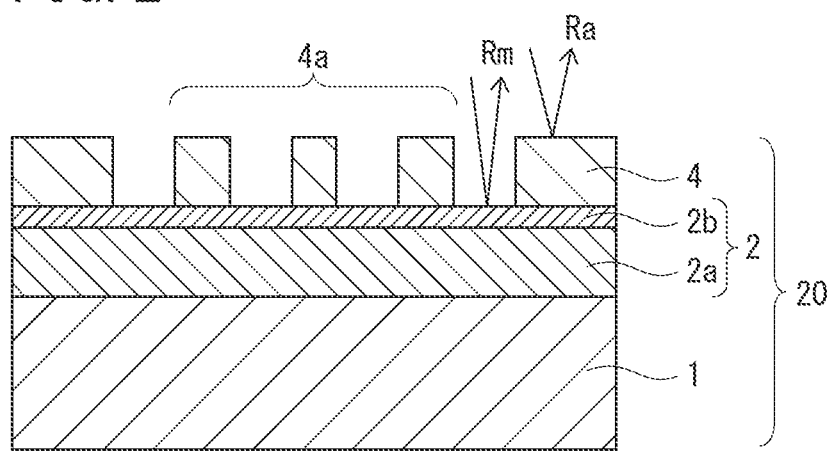
FIG. 2 is a schematic cross-sectional view illustrating the structure of a reflective photomask according to an embodiment based on the present invention.

As illustrated in FIG. 2, a reflective photomask 20 according to this embodiment is obtained by forming the absorption layer 4 of the reflective photomask blank 10 into a predetermined absorption layer pattern 4a.

As illustrated in FIG. 2, the reflective photomask 20 contains the substrate 1, the reflective layer 2 deposited on the substrate 1, and the absorption layer 4 formed on the reflective layer 2.

As described above, the reflective layer 2 is a layer reflecting incident light. The reflective layer 2 illustrated in FIG. 2 contains the multilayer reflective layer 2a having a multilayer structure and the intermediate layer 2b.

The absorption layer 4 is a layer in which the preset absorption layer pattern 4a is formed and which absorbs incident light. The absorption layer 4 contains a single layer structure or a multilayer structure in which a plurality of layers is deposited.

(Absorption Layer)

The absorption layer 4 contains a first material selected from the group consisting of tin, indium, and tellurium and a second material containing one or two or more of materials selected from the group consisting of transition metals, bismuth (Bi), and silicon (Si) at least in the outermost layer.

The first material contains any one of tin, indium, and tellurium mentioned above. The content of the first material may be determined according to the value of an extinction coefficient k required in the absorption layer 4. For example, in a case where the required value is set to 0.052 or more as the extinction coefficient k at which lithography characteristics can be satisfactorily maintained, when the first material is tin (Sn), 17 at % or more of tin (Sn) needs to be contained, when the first material is indium (In), 21 at % or more of indium (In) needs to be contained, and when the first material is tellurium (Te), 17 at % or more of tellurium (Te) needs to be contained in the same layer (per unit volume).

The content of the second material is more than 20 at % and less than 50 at % in the same layer (per unit volume).

Further, considering the processability or the heat resistance of the reflective photomask blank 10, the absorption layer 4 preferably contains oxygen at least in the outermost layer.

At this time, a ratio (B/A) of the number of atoms of the second material (B) to the total number of atoms, which is the total value, of the number of atoms of the first material and the number of oxygen atoms contained in the absorption layer 4 (A) is preferably in the range of more than ¼ and less than 1. The "contained oxygen" is contained as an oxide of the first material or the second material. The "contained oxygen" may be contained only as an oxide of the first material.

The film thickness of the absorption layer 4 is preferably 18 nm or more and less than 45 nm and more preferably 18 nm or more and less than 35 nm considering an improvement of transfer performance due to a film thickness reduction.

Herein, the absorption layer pattern 4a as the reflective photomask 20 is formed by removing parts of the absorption layer 4 of the reflective photomask blank 10. At this time, in the EUV lithography, incident light obliquely incident on the reflective photomask creates a shadow of the absorption layer pattern on the reflective layer to deteriorate the transfer performance to a wafer. The deterioration of the transfer performance can be reduced by reducing the thickness of the absorption layer 4.

When the intensity of reflected light from the reflective layer 2 is defined as Rm, the intensity of reflected light from the absorption layer 4 is defined as Ra (see FIG. 2), and an optical density OD based on the reflective layer 2 and the absorption layer 4 is defined by Equation (1) below, the value of the optical density OD is preferably 1 or more. The value of the optical density OD is not particularly limited insofar as the value is 1 or more. However, the value of the optical density OD is, for example, 2 or less considering the film thickness reduction of the absorption layer 4.

$$OD = -\log(Ra/Rm) \quad (1)$$

Further, in this embodiment, the above-described first material having an extinction coefficient k larger than a conventional absorption layer extinction coefficient is compounded in the absorption layer 4. Thus, the film thickness reduction can be achieved while maintaining the absorption performance in this embodiment.

<First Material>

Figure 3:
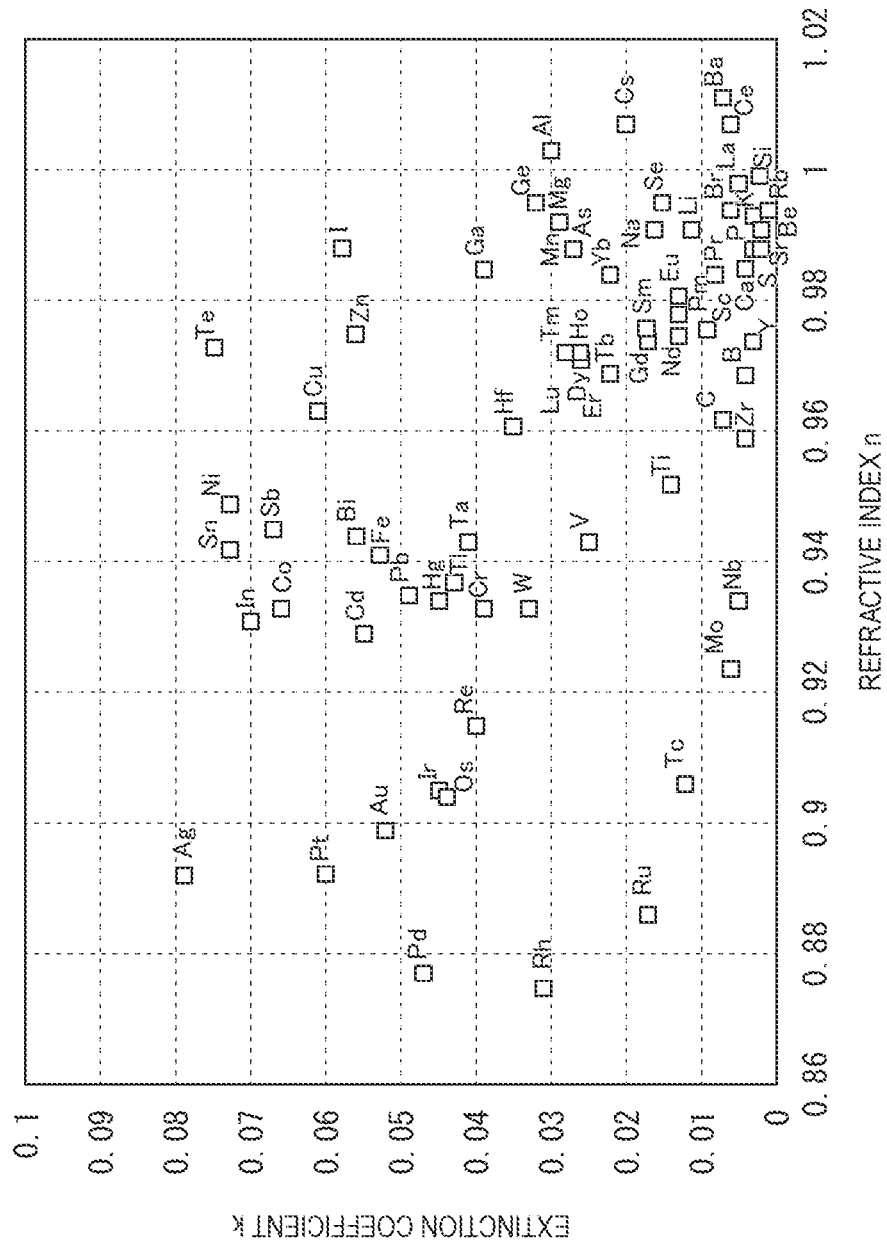
FIG. 3 is a graph illustrating the optical constants of metal materials at the wavelength of EUV light.

FIG. 3 is a graph illustrating the optical constants at the wavelength of EUV light of metal materials. The horizontal axis of FIG. 3 represents a refractive index n and the vertical axis represents the extinction coefficient k.

As illustrated in FIG. 3, examples of materials having a high extinction coefficient k include silver (Ag), nickel (Ni), tin (Sn), tellurium (Te), indium (In), and the like. The extinction coefficients of these metallic materials range from 0.07 to 0.08, which is larger than the extinction coefficient, 0.041, of tantalum (Ta), which is a conventional absorption layer material.

As described above, the absorption layer 4 can be reduced in thickness while maintaining the absorption performance by compounding the first material having a large extinction coefficient (tin (Sn), tellurium (Te), indium (In)) in the absorption layer 4 in this embodiment. In this embodiment, the deterioration of the transfer performance can be suppressed by the film thickness reduction.

The first material is usually contained in the absorption layer 4 in the form of an oxide of the first material, such as tin oxide containing tin and oxygen. It is confirmed that, even in this oxide state, the absorption performance can be maintained and the film thickness reduction can be achieved (see Examples).

Herein, the oxygen contained in the absorption layer 4 is contained in the absorption layer 4 not only in the form of the oxidation of the first material but also in the form of the oxidation, for example, of the second material.

<Optical Density OD>

Further, as one of the indices indicating the basic performance of the reflective photomask, the optical density (OD) described above is mentioned.

Figure 4:
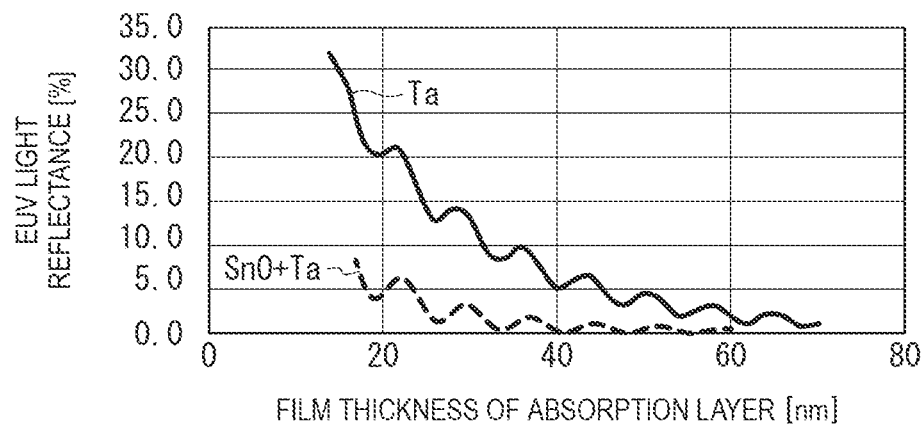
FIG. 4 is a graph illustrating simulation results of the reflectance in EUV light of a reflective photomask blank containing tin in an absorption layer.
Figure 5:
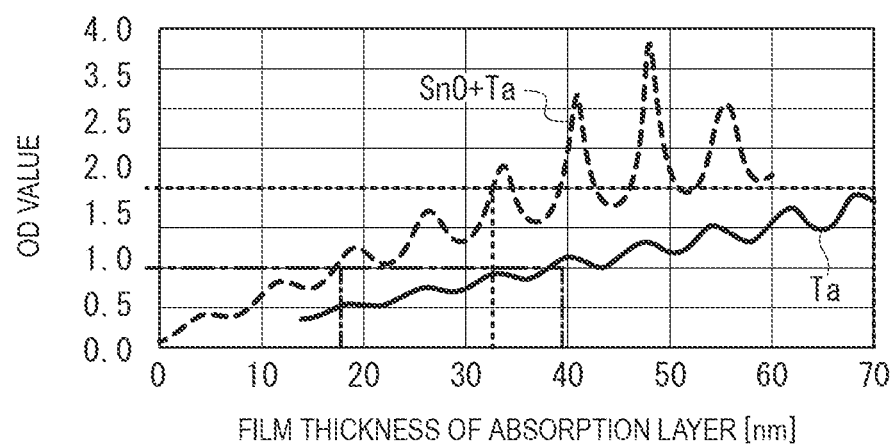
FIG. 5 is a graph illustrating simulation results of OD values at the wavelength of EUV light of the reflective photomask blank containing tin in the absorption layer.

FIG. 4 illustrates the results of simulating the EUV light reflectance in an absorption layer region containing tin. FIG. 5 illustrates the results of simulating the OD values in FIG. 4.

As the simulation conditions, the photomask structure is set to a structure configuration containing a capping layer (intermediate layer 2b) containing ruthenium (Ru) having a thickness of 2.5 nm under the absorption layer 4, the multilayer reflective layer 2a containing a multilayer of 40 pairs of deposited films each containing a pair of silicon and molybdenum under the capping layer, the substrate 1 containing flat synthetic quartz under the multilayer reflective layer 2a, and a backside conductive layer containing chromium nitride (CrN) on the backside of the substrate 1. As the absorption layer 4, two of films of a tantalum film and a tin oxide film having a tantalum content of 30 at % were used. The tantalum film has a refractive index of 0.94 and an extinction coefficient of 0.041. The tin oxide film having a tantalum content of 30 at % has a refractive index of 0.93 and an extinction coefficient of 0.062.

As is understood from FIG. 4, the EUV light reflectance can be sharply lowered when the tin oxide film containing tantalum is used as the absorption layer 4 as compared with the case where the tantalum film is used as the absorption layer 4, in a case where the absorption layers 4 have the same film thickness, for example. Further, it is found that the film thickness can be sharply reduced in a case of the same reflectance. As described above, the tin oxide film containing tantalum is effective as a constituent element constituting a high absorption layer at the wavelength of EUV light.

As is understood from FIG. 5, in order to obtain the OD value of 1 or more, the tantalum film is required to have a film thickness of at least 40 nm or more, whereas the tin oxide film containing tantalum may have a film thickness of about 18 nm, which is half or less of the film thickness of the tantalum film. As described above, it is found that the tin oxide film containing tantalum is effective as a constituent element capable of reducing the overall thickness of the absorption layer as compared with the tantalum film also from the viewpoint of the OD value.

Further, in order to obtain the OD value of 2 or more, a film thickness of at least 70 nm or more is required in the case of the tantalum film, whereas the tin oxide film containing tantalum may have a film thickness of 33 nm. As described above, it is found that the tin oxide film containing tantalum is effective as a constituent element capable of reducing the overall thickness of the absorption layer 4 as compared with the tantalum film also in the case of the OD value of 2 or more. In the conventional absorption layer, a tantalum film having a film thickness of about 70 nm (OD value of 2) is commonly used.

As described above, the use of the tin oxide film containing tantalum for the absorption layer 4 enables the thickness reduction of the absorption layer 4 while maintaining the OD value indicating the basic performance of the reflective photomask blank and the reflective photomask.

Figure 6:
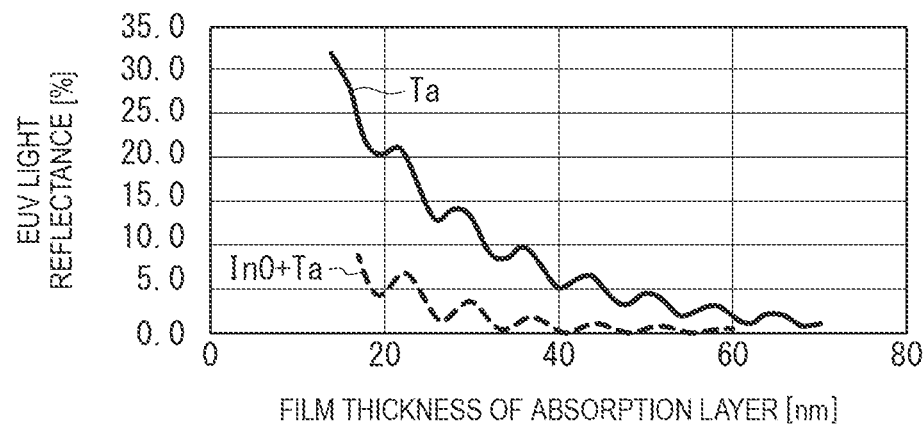
FIG. 6 is a graph illustrating simulation results of the reflectance in EUV light of a reflective photomask blank containing indium in an absorption layer.
Figure 7:
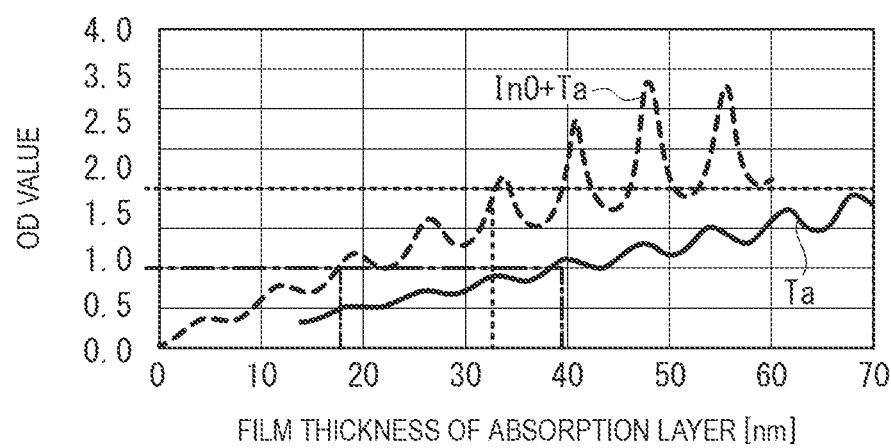
FIG. 7 is a graph illustrating simulation results of OD values at the wavelength of EUV light of the reflective photomask blank containing indium in the absorption layer.

FIG. 6 illustrates the results of simulating the EUV light reflectance in the absorption layer region containing indium. FIG. 7 illustrates the results of simulating the OD values in FIG. 6.

As the simulation conditions, the photomask structure is set to a structure configuration containing the capping layer (intermediate layer 2b) containing ruthenium (Ru) having a thickness of 2.5 nm under the absorption layer, the multilayer reflective layer 2a containing a multilayer of 40 pairs of deposited films each containing a pair silicon and molybdenum under the capping layer, the substrate containing flat synthetic quartz under the multilayer reflective layer 2a, and a backside conductive layer containing chromium nitride (CrN) on the backside of the substrate 1. As the absorption layer 4, two kinds of films of a tantalum film and an indium oxide film having a tantalum content of 30 at % were used. The tantalum film has a refractive index of 0.94 and an extinction coefficient of 0.041. The indium, oxide film having a tantalum, content of 30 at % has a refractive index of 0.93 and an extinction coefficient of 0.059.

As is understood from FIG. 6, the EUV light reflectance can be sharply lowered when the indium oxide film containing tantalum is used as the absorption layer as compared with the case where the tantalum film is used as the absorption layer, in a case where the absorption layers have the same film thickness, for example. Further, the film thickness can be sharply reduced in the case of the same reflectance. As described above, the indium oxide film containing tantalum is effective as a constituent element constituting a high absorption layer at the wavelength of EUV light.

As is understood from FIG. 7, in order to obtain the OD value of 1 or more, the tantalum film is required to have a film thickness of at least 40 nm or more, whereas the indium oxide film containing tantalum may have a film thickness of about 18 nm, which is half or less of the film thickness of the tantalum film. As described above, it is found that the indium oxide film containing tantalum is effective as a constituent element capable of reducing the overall thickness of the absorption layer as compared with the tantalum film also from the viewpoint of the OD value.

Further, in order to obtain the OD value of 2 or more, a film thickness of at least 70 nm or more is required in the case of the tantalum film, whereas the indium oxide film containing tantalum may have a film thickness of 33 nm. As described above, it is found that the indium oxide film containing tantalum is effective as a constituent element capable of reducing the overall thickness of the absorption layer as compared with the tantalum film also in the case of the OD value of 2 or more.

As described above, the use of the indium oxide film containing tantalum for the absorption layer enables the thickness reduction of the absorption layer while maintaining the OD value indicating the basic performance of the reflective photomask blank and the reflective photomask.

Figure 8:
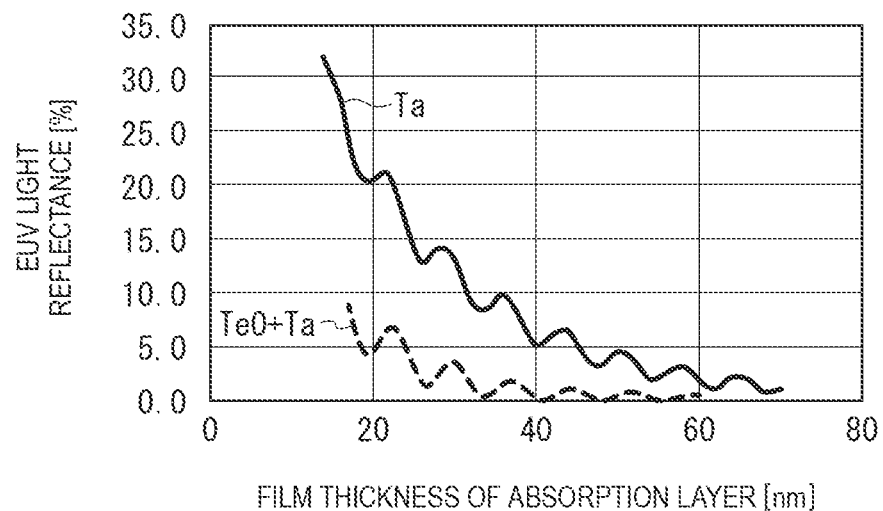
FIG. 8 is a graph illustrating simulation results of the reflectance in EUV light of a reflective photomask blank containing tellurium in an absorption layer.
Figure 9:
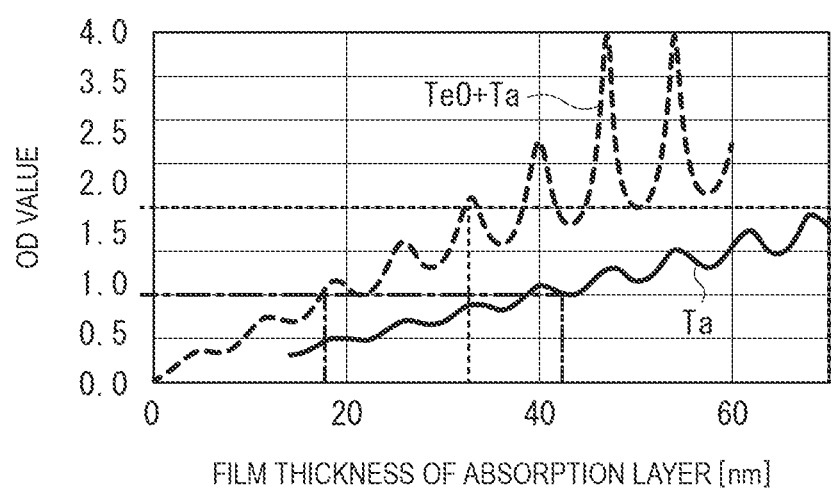
FIG. 9 is a graph illustrating simulation results of OD values at the wavelength of EUV light of the reflective photomask blank containing tellurium in the absorption layer.

FIG. 8 illustrates the results of simulating the EUV light reflectance in the absorption layer region containing tellurium. FIG. 9 illustrates the results of simulating the OD values in FIG. 8.

As the simulation conditions, the photomask structure is set to a structure configuration containing the capping layer (intermediate layer 2b) containing ruthenium (Ru) having a thickness of 2.5 nm under the absorption layer, the multilayer reflective layer 2a containing a multilayer of 40 pairs of deposited films each containing a pair of silicon and molybdenum under the capping layer, the substrate 1 containing flat synthetic quartz under the multilayer reflective layer 2a, and a backside conductive layer containing chromium nitride (CrN) on the backside of the substrate 1. For the absorption layer 4, two kinds of films of a tantalum film and a tellurium oxide film having a tantalum content of 30 at % were used. The tantalum film has a refractive index of 0.94 and an extinction coefficient of 0.041. The tellurium oxide film having a tantalum content of 30 at % has a refractive index of 0.95 and an extinction coefficient of 0.062.

As is understood from FIG. 8, the EUV light reflectance can be sharply lowered when the tellurium oxide film containing tantalum is used as the absorption layer 4 as compared with the case where the tantalum film is used as the absorption layer, in a case where the absorption layers have the same film thickness, for example. Further, the film thickness can be sharply reduced in the case of the same reflectance. As described above, the tellurium oxide film containing tantalum is effective as a constituent element constituting a high absorption layer at the wavelength of EUV light.

As is understood from FIG. 9, in order to obtain the OD value of 1 or more, the tantalum film is required to have a film thickness of at least 40 nm or more, whereas the tellurium oxide film containing tantalum may have a film thickness of about 18 nm, which is half or less of the film thickness of the tantalum film. As described above, it is found that the tellurium oxide film containing tantalum is effective as a constituent element capable of reducing the overall thickness of the absorption layer as compared with the tantalum film also from the viewpoint of the OD value.

Further, in order to obtain the OD value of 2 or more, a film thickness of at least 70 nm or more is required in the case of the tantalum film, whereas the tellurium oxide film containing tantalum may have a film thickness of 33 nm. As described above, it is found that the tellurium oxide film containing tantalum is effective as a constituent element capable of reducing the overall thickness of the absorption layer as compared with the tantalum film also in the case of the OD value of 2 or more.

As described above, the use of the tellurium oxide film containing tantalum for the absorption layer 4 enables the thickness reduction of the absorption layer 4 while maintaining the OD value indicating the basic performance of the reflective photomask blank and the reflective photomask.

<Durability (Irradiation Resistance)>

In a current EUV exposure apparatus, the photomask is placed in a hydrogen radical atmosphere. Therefore, the photomask needs to have durability against the EUV irradiation (irradiation resistance) under the hydrogen radical atmosphere.

The absorption layer 4 of this embodiment contains a second material (at least one kind of transition metals, bismuth, and silicon) having lower reactivity and lower volatility with hydrogen as compared with other metal materials. As a result, this embodiment can suppress exposure damage to the absorption layer 4 caused by the EUV light and can obtain sufficient irradiation resistance.

When the absorption layer 4 has a multilayer structure, the durability against the EUV irradiation (irradiation resistance) under the hydrogen radical atmosphere can be obtained due to the fact that at least the outermost layer thereof contains the second material.

Herein, the transition metals, bismuth, and silicon as the second material have high reactivity with fluorine, and therefore can also be processed by etching.

The transition metals contained in the absorption layer 4 may be selected from tantalum, gold, osmium, hafnium, tungsten, platinum, iridium, rhenium, and zirconium having low reactivity with hydrogen. The transition metals contained in the absorption layer 4 may include one or two or more of the metals mentioned above.

When the absorption layer 4 has a single layer structure, the total proportion of the transition metals, bismuth, and silicon contained in the absorption layer 4 is preferably more than 20 at % and less than 50 at %.

When the absorption layer 4 has a multilayer structure, the total proportion of the transition metals, bismuth, and silicon contained at least in the outermost layer of the absorption layer 4 is preferably more than 20 at % and less than 50 at %.

In the case where the absorption layer 4 is the tin oxide film, the refractive index, which is the optical constant to the EUV light, hardly changes when the total proportion of the contained transition metals, bismuth, and silicon is more than 20 at % and less than 50 at %. Further, the extinction coefficient can be maintained at 0.050 or more. Furthermore, by setting the content in this range, sufficient irradiation resistance against the EUV light can also be obtained. Thus, the tin oxide film containing transition metals, bismuth, or silicon can obtain better light absorbability than that of Ta, which is an existing absorption film forming material, and can obtain sufficient irradiation resistance against the EUV exposure.

Similarly, in the case where the absorption layer 4 is the indium oxide film, the refractive index, which is the optical constant to the EUV light, hardly changes when the total proportion of the contained transition metals, bismuth, and silicon is more than 20 at % and less than 50 at %. Further, the extinction coefficient can be maintained at 0.05 or more. Furthermore, by setting the content in this range, sufficient irradiation resistance against the EUV light can also be obtained. Thus, the indium oxide film containing the transition metals, bismuth, or silicon can obtain better light absorbability than that of Ta, which is an existing absorption film forming material, and can obtain sufficient irradiation resistance against the EUV exposure.

In the case where the absorption layer 4 is the tellurium oxide film, the refractive index, which is the optical constant to the EUV light, hardly changes when the total proportion of the contained transition metals, bismuth, and silicon is more than 20 at % and less than 50 at %. Further, the extinction coefficient can be maintained at 0.05 or more. Furthermore, by setting the content in this range, sufficient irradiation resistance against the EUV light can also obtained. Thus, the tellurium oxide film containing transition metals, bismuth, or silicon can obtain better light absorbability than that of Ta, which is an existing absorption film forming material, and can obtain sufficient irradiation resistance against the EUV exposure.

(Reflective Layer)

The reflective layer 2 illustrated in FIGS. 1 and 2 contains the multilayer reflective layer 2a and the intermediate layer 2b formed on the multilayer reflective layer 2a.

The multilayer reflective layer 2a contains, for example, a plurality of pairs of deposited films in which a silicon (Si) film and a molybdenum (Mo) film are deposited on each other.

Examples of the intermediate layer 2b include a capping layer, a buffer layer, an etching stopper layer, and the like. The capping layer functions as a protective layer for protecting the multilayer reflective layer 2a. The capping layer is formed of ruthenium (Ru), for example.

Operations and Others

As described above, the reflective photomask blank 10 and the reflective photomask 20 of this embodiment can improve the irradiation resistance during the EUV exposure, and therefore can prolong the life of the reflective photomask.

Further, this embodiment can achieve high EUV light absorbability with a smaller absorption film thickness, and therefore the influence of the projection effect is reduced and the resolution of a pattern transferred onto a wafer can be improved.

EXAMPLES

Hereinafter, Examples of the reflective photomask blank and the reflective photomask according to the present invention will be described.

First Example

First, Examples of a case where tin was compounded in the absorption layer (tin oxide film) are described.

Example 1-1

Figure 10:
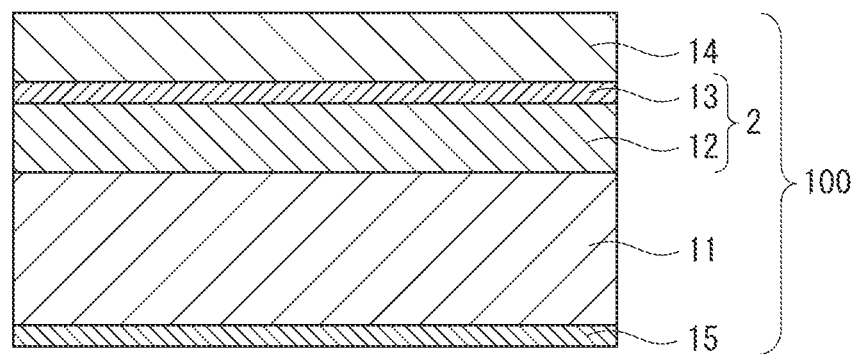
FIG. 10 is a schematic cross-sectional view illustrating the structure of a reflective photomask blank in Examples.

As illustrated in FIG. 10, a multilayer reflective layer 12 formed by the lamination of 40 pairs of deposited films each containing a pair of silicon (Si) and molybdenum, (Mo) was formed on a synthetic quartz substrate 11 having a low thermal expansion characteristic. The film thickness of the multilayer reflective layer 12 was 280 nm.

Next, a capping layer 13 formed of ruthenium (Ru) was formed as an intermediate layer on the multilayer reflective layer 12 such that the film thickness was 2.5 nm. Thus, the reflective layer 2 having the multilayer reflective layer 12 and the capping layer 13 is formed on the substrate 11. On the capping layer 13, an absorption layer 14 having a tin oxide film containing tantalum was formed by mixing tantalum, and tin oxide for film formation, thereby producing the reflective photomask blank 100. Further, as illustrated in FIG. 10, a backside conductive layer 15 formed of chromium nitride (CrN) was formed with a film thickness of 100 nm on the backside of the substrate 11.

Herein, for the formation of the films on the substrate 11, a multitarget sputtering device was used. As the absorption layer 14, a tin oxide film containing tantalum was formed. The tantalum content was carried out by adjusting the power applied to the targets of tantalum and tin in a reactive sputtering method. The film thickness of each film was controlled by a sputtering time.

Next, a method for producing the reflective photomask 200 is described with reference to FIGS. 11 to 13.

Figure 11:
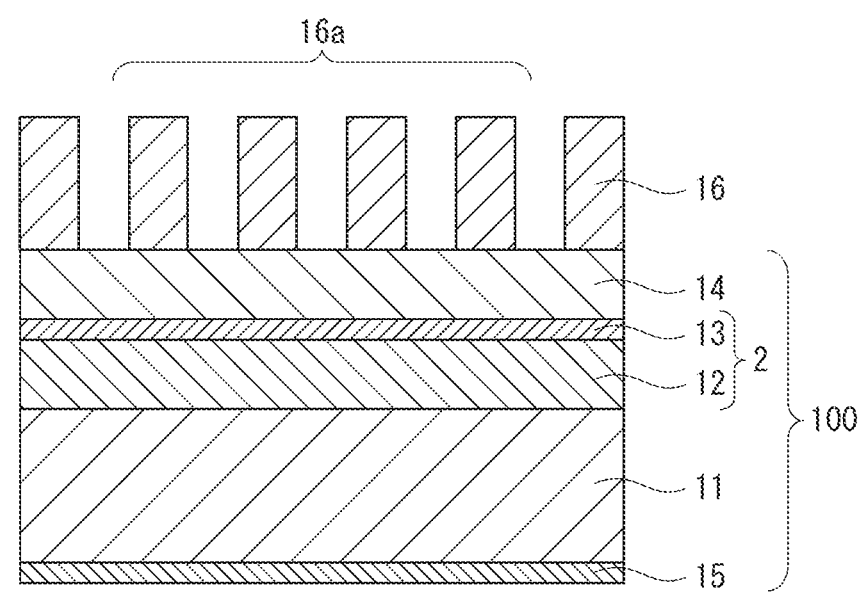
FIG. 11 is a schematic cross-sectional view illustrating a manufacturing process of a reflective photomask in Examples.

As illustrated in FIG. 11, a positive chemical amplification resist (SEBP9012: manufactured by Shin-Etsu Chemical Co., Ltd.) was applied with a film thickness of 120 nm onto the absorption layer 14 provided in the reflective photomask blank 100 to form a resist film 16.

Subsequently, a predetermined pattern is drawn on the positive chemical amplification resist by an electron beam lithography system (JBX3030: manufactured by JEOL Ltd.). Thereafter, the positive chemical amplification resist is subjected to PEE treatment at 110° C. for 10 minutes, and then subjected to spray development (SFG3000: manufactured by SIGNAMELTEC LTD.). Thus, a resist pattern 16a was formed as illustrated in FIG. 11.

Figure 12:
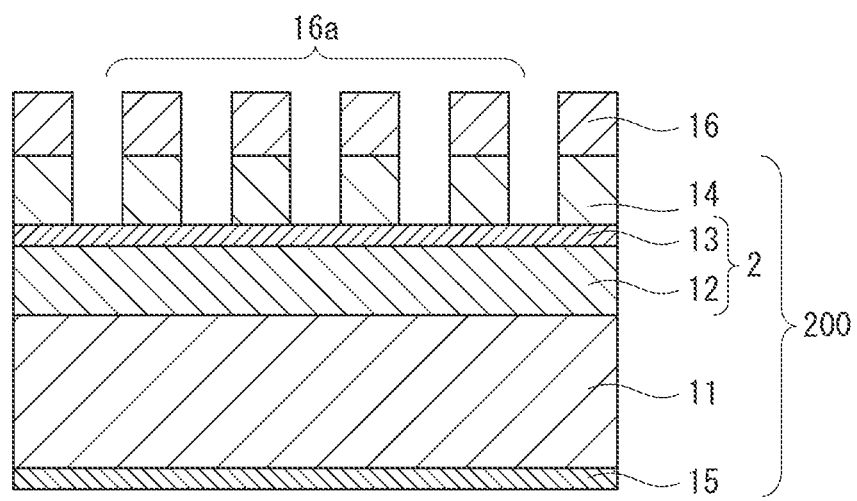
FIG. 12 is a schematic cross-sectional view illustrating a manufacturing process of the reflective photomask in Examples.
Figure 13:
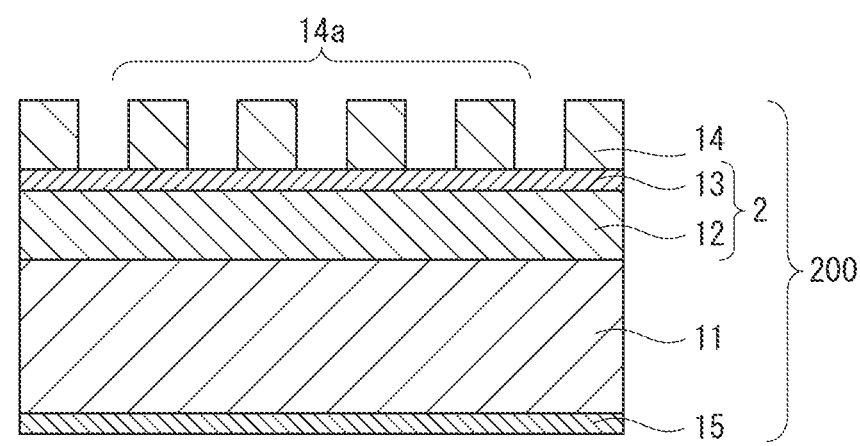
FIG. 13 is a schematic cross-sectional view illustrating the structure of the reflective photomask in Examples.

Next, the absorption layer 14 was patterned by dry etching mainly using a chlorine-based gas with the resist pattern 16a as an etching mask to form an absorption layer pattern on the absorption layer 14 as illustrated in FIG. 12. Next, the remaining resist pattern 16a was peeled off to produce a reflective photomask 200 according to this example.

In this example, the absorption layer pattern 14a formed on the absorption layer 14 contains an LS (line-and-space) pattern with a line width of 64 nm on the reflective photomask 200 for transfer evaluation, an LS pattern with a line width of 200 nm for film thickness measurement of the absorption layer using AFM, and 4 mm square absorption layer removed portions for EUV reflectance measurement.

In Example 1-1, the atomic ratio of the tantalum in the absorption layer 14 containing the tantalum-containing tin oxide was set to three kinds of 21 at %, 30 at %, and 49 at %. The film thickness of the absorption layer 14 was set to two kinds of 33 nm and 18 nm. Further, with respect to the case of 21 at % tantalum, a plurality of samples was produced in which the film thickness of the absorption layer 14 was varied in the range of 16 nm to 45 nm (see Tables 1 and 3).

Example 1-2

The reflective photomask blank 100 and the reflective photomask 200 were produced in the same manner as in Example 1-1 by forming a tin oxide film containing bismuth as the absorption layer 14 and changing the target to a combination of tin and bismuth.

In Example 1-2, the atomic ratio of the bismuth in the absorption layer 14 containing the bismuth-containing tin oxide was set to two kinds of 21 at % and 40 at %. The film thickness of the absorption layer 14 was set to two kinds of 33 nm and 18 nm (see Table 2).

Comparative Example 1-1

In Comparative Example 1-1, a reflective photomask blank and a reflective photomask were produced in the same manner as in Example 1-1 by forming a tantalum film as the absorption layer and changing the target to only tantalum (However, the target is only tantalum, and therefore the adjustment of the content ratio by adjusting the applied power is not performed.). The film thickness of the absorption layer was set to two kinds of film thicknesses of 70 nm and 40 nm.

Comparative Example 1-2

In Comparative Example 1-2, a reflective photomask blank and a reflective photomask were produced in the same manner as in Example 1-1 by forming a tin oxide film as the absorption layer and changing the target to only tin (However, the target is only tin, and therefore the adjustment of the content ratio by adjusting the applied power is not performed.). The film thickness of the absorption layer was set to two kinds of 26 nm and 17 nm.

Comparative Example 1-3

In Comparative Example 1-3, a reflective photomask blank and a reflective photomask were produced in the same manner as in Example 1-1 by forming a tin oxide film containing tantalum as the absorption layer similarly to Example 1-1. The atomic ratio of the tantalum in the absorption layer containing the tantalum-containing tin oxide was set to 70 at %. The film thickness of the absorption layer was set to two kinds of 40 nm and 24 nm.

In Examples and Comparative Examples described above, the film thickness was measured and confirmed by a transmission electron microscope and the atomic ratio in the absorption layer was measured and confirmed by XPS (X-ray photoelectron spectroscopy).

A reflectance Rm of the reflective layer region and a reflectance Ra of the absorption layer region of the reflective photomasks produced in Examples and Comparative Examples described above were measured by an EUV light reflectance meter. The reflectance Rm was measured in the 4 mm square absorption layer removed portions. From the measurement result, the OD value was calculated using Equation (1).

(Wafer Exposure Evaluation)

The absorption layer pattern of the reflective photomask produced in each of Examples and Comparative Examples was transferred and exposed onto a semiconductor wafer (not illustrated) coated with a positive chemical amplification resist for EUV using an EUV exposure apparatus (NXE3300B: manufactured by ASML). The observation and the line width measurement of the transferred resist pattern were carried out to confirm the resolution by an electron beam dimension measuring machine.

(Irradiation Resistance)

The irradiation resistance during the EUV exposure of the reflective photomask was evaluated using the EUV exposure apparatus NXE3300B (manufactured by ASML). At this time, the reflective photomasks produced in Examples and Comparative Examples were irradiated with 30 kJ/cm$^2$ EUV light. As the atmosphere during the exposure, hydrogen was introduced under the condition of a vacuum degree of 3 Pa. A change in the film thickness of the absorption layer before and after the EUV light irradiation was confirmed using an Atomic Force Microscope (AFM). The measurement was performed with an LS pattern with a line width of 200 nm.

It was determined that there was no damage when the film thickness change of the absorption layer was 1.0 nm or less.

The evaluation results are shown in Tables 1 to 3

TABLE 1

| | | Material characteristics | | | Mask characteristics | | Lithography |
| | Material | Refractive index n | Extinction coefficient k | Film thickness | OD | Irradiation resistance | characteristics Resolution |
|---|---|---|---|---|---|---|---|
| Comp. 1-1 | Ta | 0.94 | 0.041 | 70 nm | 1.8 | 0.6 nm | Non-resolved |
| | | | | 40 nm | 1.1 | | 22 nm |
| Comp. 1-2 | SnO | 0.94 | 0.072 | 26 nm | 2.0 | 1.6 nm | 14 nm |
| | | | | 17 nm | 1.1 | | 16 nm |
| Ex. 1-1 | SnO/Ta (79/21) | 0.93 | 0.065 | 33 nm | 2.2 | 0.8 nm | 14 nm |
| | | | | 18 nm | 1.1 | | 15 nm |
| | SnO/Ta (70/30) | 0.93 | 0.062 | 33 nm | 2.1 | 0.7 nm | 14 nm |
| | | | | 18 nm | 1.1 | | 15 nm |
| | SnO/Ta (51/49) | 0.93 | 0.056 | 33 nm | 1.9 | 0.7 nm | 14 nm |
| | | | | 18 nm | 1.0 | | 15 nm |
| Comp. 1-3 | SnO/Ta (30/70) | 0.94 | 0.050 | 40 nm | 2.0 | 0.7 nm | 18 nm |
| | | | | 24 nm | 1.1 | | 19 nm |

TABLE 2

| | | Material characteristics | | | Mask characteristics | | Lithography |
| | Material | Refractive index n | Extinction coefficient k | Film thickness | OD | Irradiation resistance | characteristics Resolution |
|---|---|---|---|---|---|---|---|
| Comp. 1-2 | SnO | 0.94 | 0.072 | 26 nm | 2.0 | 1.6 nm | 14 nm |
| | | | | 17 nm | 1.1 | | 16 nm |
| Ex. 1-2 | SnO/Bi (79/21) | 0.93 | 0.068 | 33 nm | 2.2 | 0.7 nm | 15 nm |
| | | | | 18 nm | 1.1 | | 15 nm |
| | SnO/Bi (60/40) | 0.93 | 0.065 | 33 nm | 2.2 | 0.7 nm | 14 nm |
| | | | | 18 nm | 1.1 | | 15 nm |

TABLE 3

| | Material | Material characteristics | | | Mask characteristics | | Lithography characteristics |
| --- | --- | --- | --- | --- | --- | --- | --- |
| | | Refractive index n | Extinction coefficient k | Film thickness | OD | Irradiation resistance | Resolution |
| Ex. 1-1 | SnO/Ta (79/21) | 0.93 | 0.065 | 45 nm | 1.8 | 0.8 nm | 17 nm |
| | | | | 36 nm | 1.7 | | 17 nm |
| | | | | 34 nm | 2.4 | | 14 nm |
| | | | | 32 nm | 1.7 | | 14 nm |
| | | | | 30 nm | 1.3 | | 14 nm |
| | | | | 20 nm | 1.2 | | 15 nm |
| | | | | 18 nm | 1.1 | | 15 nm |
| | | | | 16 nm | 0.8 | | 20 nm |

Table 1 illustrates the reflective photomasks having OD values close to 1.0 and 2.0 among the reflective photomasks containing the tantalum film, the tin oxide film, and the tantalum-containing tin oxide film as the absorption layer. Good results were obtained in terms of the EUV irradiation resistance under the hydrogen atmosphere of the absorption layer except for the tin oxide film (Comparative Example 1-2). The resolution was 20 nm or less, which was good, except when the absorption layer was the tantalum film (Comparative Example 1-1). By forming the tantalum-containing tin oxide film as the absorption layer, both good irradiation resistance and good resolution were achieved (Example 1-1, Comparative Example 1-3).

Further, it was found that, by setting the tantalum content of the tantalum-containing tin oxide film to more than 20 at % and less than 50 at, the resolution became 15 nm or less as in Example 1-1, which was much better.

Table 2 illustrates the reflective photomasks containing the bismuth-containing tin oxide film as the absorption layer (Example 1-2). In Example 1-2, the EUV irradiation resistance under the hydrogen atmosphere of the absorption layer was 1.0 nm or less and the resolution was 15 nm or less. As described above, good results were obtained in terms of both the irradiation resistance and the resolution based on this example.

Table 3 illustrates the reflective photomasks containing the tantalum-containing tin oxide film having a tantalum content of 21 at % as the absorption layer. Then, the film thickness of the absorption layer was varied in the range of 16 nm to 45 nm for evaluation. The EUV irradiation resistance under the hydrogen atmosphere of the absorption layer was 1.0 nm or less and the resolution was 20 nm or less, both of which were good. Further, as is understood from Table 3, by setting the film thickness of the absorption layer to 18 nm or more and 45 nm or less, the resolution was 17 nm or less, which was a better result. Further, by setting the film thickness of the absorption layer to 18 nm or more and 35 nm or less, the resolution was 15 nm or less, which was a much better result.

Second Example

Next, Examples of a case where indium was compounded in the absorption layer (indium oxide film) are described.

Example 2-1

As illustrated in FIG. 10, the multilayer reflective layer 12 formed by the lamination of 40 pairs of deposited films each containing a pair of silicon (Si) and molybdenum (Mo) is formed on the synthetic quartz substrate 11 having a low thermal expansion characteristic. The film thickness of the multilayer reflective layer 12 was 280 nm.

Next, the capping layer 13 formed of ruthenium (Ru) was formed as an intermediate layer on the multilayer reflective layer 12 such that the film thickness was 2.5 nm. Thus, the reflective layer 2 having the multilayer reflective layer 12 and the capping layer 13 is formed on the substrate 11. On the capping layer 13, the absorption layer 14 having an indium oxide film containing tantalum was formed by mixing tantalum and indium oxide for film formation, thereby producing the reflective photomask blank 100. Further, as illustrated in FIG. 10, the backside conductive layer 15 formed of chromium nitride (CrN) was formed with a film thickness of 100 nm on the backside of the substrate 11.

For the formation of the films on the substrate 11, a multitarget sputtering device was used. As the absorption layer 14, an indium oxide film containing tantalum was formed. The tantalum content was carried out by adjusting the power applied to the targets of tantalum and indium in a reactive sputtering method. The film thickness of each film was controlled by a sputtering time.

The reflective photomask 200 was produced in the same manner as in the first example.

In Example 2-1 the atomic ratio of the tantalum in the absorption layer 14 containing the tantalum-containing indium oxide was set to three kinds of 21 at %, 30 at %, and 49 at %. The film thickness of the absorption layer 14 was set to two kinds of 33 nm and 18 nm. With respect to the case of 21 at % tantalum, the film thickness of the absorption layer 14 was varied in the range of 16 nm to 45 nm.

Example 2-2

The reflective photomask blank 100 and the reflective photomask 200 were produced in the same manner as in Example 1-1 by forming an indium oxide film containing tungsten as the absorption layer 14 and changing the target to a combination of indium and tungsten.

In Example 2-2, the atomic ratio of the tungsten in the absorption layer 14 containing the tungsten-containing indium oxide was set to two kinds of 21 at % and 40 at %. The film thickness of the absorption layer 14 was set to two kinds of 34 nm and 18 nm.

Comparative Example 2-1

A reflective photomask blank and a reflective photomask were produced in the same manner as in Example 2-1 by forming a tantalum film as the absorption layer and changing the target to only tantalum (However, the target is only tantalum, and therefore the adjustment of the content ratio by adjusting the applied power is not performed.). The film thickness of the absorption layer was set to two kinds of 70 nm and 40 nm.

Comparative Example 2-2

A reflective photomask blank and a reflective photomask were produced in the same manner as in Example 2-1 by forming an indium oxide film as the absorption layer and changing the target to only indium (However, the target is only indium, and therefore the adjustment of the content ratio by adjusting the applied power is not performed.). The film thickness of the absorption layer was set to two kinds of 27 nm and 18 nm.

Comparative Example 2-3

A reflective photomask blank and a reflective photomask were produced in the same manner as in Example 2-1 by forming an indium oxide film containing tantalum as the absorption layer. The atomic ratio of the tantalum in the absorption layer containing the tantalum-containing indium oxide was 70 at %. The film thickness of the absorption layer was set to two kinds of 40 nm and 24 nm.

The evaluation was carried out by the same evaluation method as the method in the first example.

The evaluation results are shown in Tables 4 to 6.

TABLE 4

| | | Material characteristics | | | Mask characteristics | | Lithography characteristics |
|---|---|---|---|---|---|---|---|
| | Material | Refractive index n | Extinction coefficient k | Film thickness | OD | Irradiation resistance | Resolution |
| Comp. 2-1 | Ta | 0.94 | 0.041 | 70 nm | 1.8 | 0.6 nm | Non-resolved |
| | | | | 40 nm | 1.1 | | 22 nm |
| Comp. 2-2 | InO | 0.93 | 0.071 | 27 nm | 1.9 | 1.6 nm | 14 nm |
| | | | | 18 nm | 1.2 | | 16 nm |
| Ex. 2-1 | InO/Ta (79/21) | 0.93 | 0.062 | 33 nm | 2.0 | 0.7 nm | 15 nm |
| | | | | 18 nm | 1.1 | | 15 nm |
| | InO/Ta (70/30) | 0.93 | 0.059 | 33 nm | 1.9 | 0.6 nm | 14 nm |
| | | | | 18 nm | 1.0 | | 15 nm |
| | InO/Ta (51/49) | 0.93 | 0.054 | 33 nm | 1.8 | 0.6 nm | 15 nm |
| | | | | 18 nm | 0.9 | | 15 nm |
| Comp. 2-3 | InO/Ta (30/70) | 0.94 | 0.049 | 40 nm | 1.9 | 0.6 nm | 19 nm |
| | | | | 24 nm | 1.0 | | 19 nm |

TABLE 5

| | | Material characteristics | | | Mask characteristics | | Lithography characteristics |
|---|---|---|---|---|---|---|---|
| | Material | Refractive index n | Extinction coefficient k | Film thickness | OD | Irradiation resistance | Resolution |
| Comp. 2-2 | InO | 0.93 | 0.071 | 27 nm | 1.9 | 1.6 nm | 14 nm |
| | | | | 18 nm | 1.2 | | 16 nm |
| Ex. 2-2 | InO/W (79/21) | 0.92 | 0.060 | 34 nm | 2.2 | 0.6 nm | 15 nm |
| | | | | 18 nm | 1.0 | | 15 nm |
| | InO/W (60/40) | 0.93 | 0.053 | 34 nm | 1.9 | 0.6 nm | 14 nm |
| | | | | 18 nm | 1.0 | | 15 nm |

TABLE 6

| | | Material characteristics | | | Mask characteristics | | Lithography characteristics |
|---|---|---|---|---|---|---|---|
| | Material | Refractive index n | Extinction coefficient k | Film thickness | OD | Irradiation resistance | Resolution |
| Ex. 2-1 | InO/Ta (79/21) | 0.93 | 0.062 | 45 nm | 1.8 | 0.7 nm | 17 nm |
| | | | | 36 nm | 1.7 | | 17 nm |
| | | | | 34 nm | 2.3 | | 14 nm |
| | | | | 32 nm | 1.6 | | 15 nm |
| | | | | 30 nm | 1.3 | | 14 nm |
| | | | | 20 nm | 1.2 | | 15 nm |
| | | | | 18 nm | 1.1 | | 15 nm |
| | | | | 16 nm | 0.8 | | 20 nm |

Table 4 illustrates the reflective photomasks having OD values close to 1.0 and 2.0 among the reflective photomasks containing the tantalum film, the indium oxide film, and the tantalum-containing indium oxide film as the absorption layer. Good results were obtained in terms of the EUV irradiation resistance under the hydrogen atmosphere of the absorption layer except for the indium oxide film (Comparative Example 2-2). The resolution was 20 nm or less, which was good, except when the absorption layer was the tantalum film (Comparative Example 2-1). Further, it was found that, by forming the tantalum-containing indium oxide film as the absorption layer, both good irradiation resistance and good resolution were achieved (Example 2-1 and Comparative Example 2-3). Then, it was found that, by setting the tantalum content of the tantalum-containing indium oxide film to more than 20 at % and less than 50 at % as in Example 2-1, the resolution became 15 nm or less, which was much better.

Table 5 illustrates the reflective photomasks containing the tungsten-containing indium oxide film as the absorption layer (Example 2-2). In Example 2-2, the EUV irradiation resistance under the hydrogen atmosphere of the absorption layer was 1.0 nm or less and the resolution was 15 nm or less. Good results were obtained in terms of both the irradiation resistance and the resolution.

Table 6 illustrates the reflective photomasks containing the tantalum-containing indium oxide film having a tantalum content of 21 at % as the absorption layer. The film thickness of the absorption layer was varied in the range of 16 nm and 45 nm for evaluation. According to Example 2-1, the EUV irradiation resistance under the hydrogen atmosphere of the absorption layer was 1.0 nm or less and the resolution was 20 nm or less, both of which were good. By setting the film thickness of the absorption layer to 18 nm or more and 45 nm or less, the resolution was 17 nm or less, which was a better result. Further, by setting the film thickness of the absorption layer to 18 nm or more and 35 nm or less, the resolution was 15 nm or less, which was a much better result.

Third Example

Next, Examples of a case where tellurium was compounded in the absorption layer (tellurium oxide film) are described.

Example 3-1

As illustrated in FIG. 10, the multilayer reflective layer 12 formed by the lamination of 40 pairs of deposited films each containing a pair of silicon (Si) and molybdenum (Mo) is formed on the synthetic quartz substrate 11 having a low thermal expansion characteristic. The film thickness of the multilayer reflective layer 12 was 280 nm.

Next, the capping layer 13 formed of ruthenium (Ru) was formed as an intermediate layer on the multilayer reflective layer 12 such that the film thickness was 2.5 nm. Thus, the reflective layer 2 having the multilayer reflective layer 12 and the capping layer 13 is formed on the substrate 11. On the capping layer 13, the absorption layer 14 having a tellurium oxide film containing tantalum was formed by mixing tantalum and tellurium oxide for film formation, thereby producing the reflective photomask blank 100. Further, as illustrated in FIG. 10, the backside conductive layer 15 formed of chromium nitride (CrN) was formed with a film thickness of 100 nm on the backside of the substrate 11.

For the formation of the films on the substrate 11, a multitarget sputtering device was used. As the absorption layer 14, a tellurium oxide film containing tantalum was formed. The tantalum content was carried out by adjusting the power applied to the targets of tantalum and tellurium in a reactive sputtering method. The film thickness of each film was controlled by a sputtering time.

The production of the reflective photomask 200 was performed in the same manner as in the first embodiment.

In Example 3-1, the atomic ratio of the tantalum in the absorption layer 14 containing the tantalum-containing tellurium oxide was set to three kinds of 21 at %, 30 at %, and 49 at %. The film thickness of the absorption layer 14 was set to two kinds of 33 nm and 18 nm. With respect to the case of 21 at % tantalum, the film thickness of the absorption layer 14 was varied in the range of 16 nm to 45 nm.

Example 3-2

The reflective photomask blank 100 and the reflective photomask 200 were produced in the same manner as in Example 1-1 by forming a tellurium oxide film containing hafnium as the absorption layer 14 and changing the target to a combination of tellurium and hafnium.

In Example 3-2, the atomic ratio of the hafnium in the absorption layer 14 containing the hafnium-containing tellurium oxide was set to two kinds of 21 at % and 40 at %. The film thickness of the absorption layer 14 was set to two kinds of 33 nm and 18 nm.

Comparative Example 3-1

In Comparative Example 3-1, a reflective photomask blank and a reflective photomask were produced in the same manner as in Example 3-1 by forming a tantalum film as the absorption layer and changing the target to only tantalum (However, the target is only tantalum, and therefore the adjustment of the content ratio by adjusting the applied power is not performed.). The film thickness of the absorption layer was set to two kinds of 70 nm and 40 nm.

Comparative Example 3-2

In Comparative Example 3-2, a reflective photomask blank and a reflective photomask were produced in the same manner as in Example 3-1 by forming a tellurium oxide film as the absorption layer and changing the target to only tellurium (However, the target is only tellurium, and therefore the adjustment of the content ratio by adjusting the applied power is not performed.). The film thickness of the absorption layer was set to two kinds of 31 nm and 17 nm.

Comparative Example 3-3

In Comparative Example 3-3, a reflective photomask blank and a reflective photomask were produced in the same manner as in Example 3-1 by forming a tellurium oxide film containing tantalum as the absorption layer. The atomic ratio of the tantalum in the absorption layer containing the tantalum-containing tellurium oxide was 70 at %. The film thickness of the absorption layer was set to two kinds of 40 nm and 24 nm.

The evaluation was performed by the same method as that of the first example.

The evaluation results are shown in Tables 7 to 9.

TABLE 7

| | Material | Material characteristics | | | Mask characteristics | | Lithography characteristics |
| | | Refractive index n | Extinction coefficient k | Film thickness | OD | Irradiation resistance | Resolution |
|---|---|---|---|---|---|---|---|
| Comp. 3-1 | Ta | 0.94 | 0.041 | 70 nm<br>40 nm | 1.8<br>1.1 | 0.6 nm | Non-resolved<br>22 nm |
| Comp. 3-2 | TeO | 0.96 | 0.071 | 31 nm<br>17 nm | 1.9<br>1.1 | 1.6 nm | 15 nm<br>16 nm |
| Ex. 3-1 | TeO/Ta (79/21) | 0.95 | 0.065 | 33 nm<br>18 nm | 2.1<br>1.0 | 0.8 nm | 13 nm<br>14 nm |
| | TeO/Ta (70/30) | 0.95 | 0.062 | 33 nm<br>18 nm | 2.1<br>1.1 | 0.8 nm | 14 nm<br>14 nm |
| | TeO/Ta (51/49) | 0.95 | 0.056 | 33 nm<br>18 nm | 1.9<br>1.0 | 0.7 nm | 14 nm<br>15 nm |
| Comp. 3-3 | TeO/Ta (30/70) | 0.95 | 0.050 | 40 nm<br>24 nm | 2.0<br>1.0 | 0.7 nm | 18 nm<br>18 nm |

TABLE 8

| | Material | Material characteristics | | | Mask characteristics | | Lithography characteristics |
| | | Refractive index n | Extinction coefficient k | Film thickness | OD | Irradiation resistance | Resolution |
|---|---|---|---|---|---|---|---|
| Comp. 3-2 | TeO | 0.96 | 0.071 | 31 nm<br>17 nm | 1.9<br>1.1 | 1.6 nm | 15 nm<br>16 nm |
| Ex. 3-2 | TeO/Hf (79/21) | 0.96 | 0.063 | 33 nm<br>18 nm | 2.1<br>1.1 | 0.7 nm | 14 nm<br>15 nm |
| | TeO/Hf (60/40) | 0.96 | 0.057 | 33 nm<br>18 nm | 1.8<br>1.0 | 0.6 nm | 14 nm<br>15 nm |

TABLE 9

| | Material | Material characteristics | | | Mask characteristics | | Lithography characteristics |
| | | Refractive index n | Extinction coefficient k | Film thickness | OD | Irradiation resistance | Resolution |
|---|---|---|---|---|---|---|---|
| Ex. 3-1 | TeO/Ta (79/21) | 0.95 | 0.065 | 45 nm<br>36 nm<br>34 nm<br>32 nm<br>30 nm<br>20 nm<br>18 nm<br>16 nm | 2.2<br>1.6<br>1.9<br>2.1<br>1.5<br>1.1<br>1.2<br>0.9 | 0.8 nm | 17 nm<br>17 nm<br>14 nm<br>13 nm<br>14 nm<br>15 nm<br>14 nm<br>20 nm |

Table 7 illustrates the reflective photomasks having OD values close to 1.0 and 2.0 among the reflective photomasks containing the tantalum film, the tellurium oxide film, and the tantalum-containing tellurium oxide film as the absorption layer. Good results were obtained in terms of the EUV irradiation resistance under the hydrogen atmosphere of the absorption layer except for the tellurium oxide film (Comparative Example 3-2). The resolution was 20 nm or less, which was good, except when the absorption layer was the tantalum film (Comparative Example 3-1). It is found that, by forming the tantalum-containing tellurium oxide film as the absorption layer, both good irradiation resistance and good resolution are achieved. It was found that, by setting the tantalum content of the tantalum-containing tellurium oxide film to more than 20 at % and less than 50 at % as in Example 3-1, the resolution became 15 nm or less, which was much better.

Table 8 illustrates the reflective photomasks containing the hafnium-containing tellurium oxide film as the absorption layer (Example 3-2). The EUV irradiation resistance under the hydrogen atmosphere of the absorption layer was 1.0 nm or less and the resolution was 15 nm or less. In Example 3-2, good results were obtained in terms of both the irradiation resistance and the resolution.

Table 9 illustrates the reflective photomasks containing the tantalum-containing tellurium oxide film having a tantalum content of 21 at % as the absorption layer. The film thickness of the absorption layer was evaluated in the range of 16 nm to 45 nm. The EUV irradiation resistance under the hydrogen atmosphere of the absorption layer was 1.0 nm or less and the resolution was 20 nm or less, both of which were good. By setting the film thickness of the absorption layer to 18 nm or more and 45 nm or less, the resolution was 17 nm or less, which was a better result. Further, by setting the film thickness of the absorption layer to 18 nm or more and 35 nm or less, the resolution was 15 nm or less, which was a much better result.

REFERENCE SIGNS LIST 10, 100 reflective photomask blank
20, 200 reflective photomask
1 substrate
2 reflective layer
2a multilayer reflective layer
2b intermediate layer
4 absorption layer
4a absorption layer pattern
11 substrate
12 multilayer reflective layer
13 capping layer
14 absorption layer
14a absorption layer pattern
15 backside conductive layer
16 resist film
16a resist pattern

The invention claimed is:

1. A reflective photomask blank comprising:
a reflective layer configured to reflect incident light; and
an absorption layer configured to absorb incident light,
the reflective layer and the absorption layer being formed in this order on one surface side of a substrate, wherein
the absorption layer contains a first material selected from the group consisting of tin, indium, and tellurium and a second material containing one or two or more of materials selected from the group consisting of transition metals, bismuth (Bi), and silicon (Si) at least in an outermost layer, and
a content of the second material is more than 20 at % and less than 50 at % in a same layer.

2. The reflective photomask blank according to claim 1, wherein
the absorption layer further contains oxygen at least in the outermost layer, and
a ratio (B/A) of a number of atoms of the second material (B) to a total number of atoms of the first material and the oxygen (A) is in a range of more than ¼ and less than 1.

3. The reflective photomask blank according to claim 1, wherein
the transition metals include one or two or more selected from the group consisting of tantalum, gold, osmium, hafnium, tungsten, platinum, iridium, rhenium, and zirconium.

4. The reflective photomask blank according to claim 1, wherein
when intensity of reflected light from the reflective layer is defined as Rm, intensity of reflected light from the absorption layer is defined as Ra, and an optical density OD based on the reflective layer and the absorption layer is defined by Equation (1) below,
a value of the optical density OD is 1 or more, $$OD=-\log(Ra/Rm) \quad (1).$$

5. The reflective photomask blank according to claim 1, wherein
a film thickness of the absorption layer is 18 nm or more and less than 45 nm.

6. The reflective photomask blank according to claim 1, wherein
the reflective layer contains a multilayer reflective layer containing a multilayer structure and an intermediate layer formed on the multilayer reflective layer.

7. The reflective photomask blank according to claim 2, wherein
the transition metals include one or two or more selected from the group consisting of tantalum, gold, osmium, hafnium, tungsten, platinum, iridium, rhenium, and zirconium.

8. The reflective photomask blank according to claim 2, wherein
when intensity of reflected light from the reflective layer is defined as Rm, intensity of reflected light from the absorption layer is defined as Ra, and an optical density OD based on the reflective layer and the absorption layer is defined by Equation (1) below,
a value of the optical density OD is 1 or more, $$OD=-\log(Ra/Rm) \quad (1).$$

9. The reflective photomask blank according to claim 3, wherein
when intensity of reflected light from the reflective layer is defined as Rm, intensity of reflected light from the absorption layer is defined as Ra, and an optical density OD based on the reflective layer and the absorption layer is defined by Equation (1) below,
a value of the optical density OD is 1 or more, $$OD=-\log(Ra/Rm) \quad (1).$$

10. The reflective photomask blank according to claim 2, wherein
a film thickness of the absorption layer is 18 nm or more and less than 45 nm.

11. The reflective photomask blank according to claim 3, wherein
a film thickness of the absorption layer is 18 nm or more and less than 45 nm.

12. The reflective photomask blank according to claim 4, wherein
a film thickness of the absorption layer is 18 nm or more and less than 45 nm.

13. The reflective photomask blank according to claim 2, wherein
the reflective layer contains a multilayer reflective layer containing a multilayer structure and an intermediate layer formed on the multilayer reflective layer.

14. The reflective photomask blank according to claim 3, wherein
the reflective layer contains a multilayer reflective layer containing a multilayer structure and an intermediate layer formed on the multilayer reflective layer.

15. The reflective photomask blank according to claim 4, wherein
the reflective layer contains a multilayer reflective layer containing a multilayer structure and an intermediate layer formed on the multilayer reflective layer.

16. The reflective photomask blank according to claim 5, wherein
the reflective layer contains a multilayer reflective layer containing a multilayer structure and an intermediate layer formed on the multilayer reflective layer.

17. A reflective photomask comprising:
a reflective layer formed on one surface side of a substrate and configured to reflect incident light; and
an absorption layer formed by a predetermined pattern on the reflective layer and configured to absorb incident light, wherein
at least an outermost layer of the absorption layer contains a first material selected from the group consisting of tin, indium, and tellurium and a second material containing one or two or more of materials selected from the group consisting of transition metals, bismuth (Bi), and silicon (Si), and a content of the second material is more than 20 at % and less than 50 at % in a same layer.

* * * * *